June 17, 1969 W. MEER ET AL 3,450,964

MESA TRANSISTOR WITH AN ASYMMETRICAL U-SHAPE BASE ELECTRODE

Filed June 26, 1967

United States Patent Office 3,450,964

Patented June 17, 1969

3,450,964
MESA TRANSISTOR WITH AN ASYMMETRICAL U-SHAPE BASE ELECTRODE

Winfried Meer, Hohenbrunn, and Hans Hargasser and Wolfgang Schembs, Munich, Germany, assignors to Siemens Aktiengesellschaft, a corporation of Germany Filed June 26, 1967, Ser. No. 648,666
Claims priority, application Germany, July 6, 1966, S 104,643
Int. Cl. H01l 11/02
U.S. Cl. 317—235 5 Claims

ABSTRACT OF THE DISCLOSURE

Described is a mesa transistor, having a substrate semiconductor body which serves as collector, with a base region and an emitter region located in said substrate. The emitter electrode is surrounded in the form of a U by the base electrode. The base electrode is asymmetrical with respect to an axis which extends parallel to the legs of the U.

Figure 1:
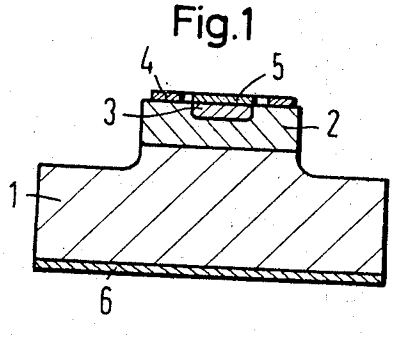

The present invention relates to a mesa transistor with a substrate semiconductor body, serving as a collector, and with a base region and an emitter region on the mesa.

It is known to produce such transistors from a semiconductor substrate body of a specified conductance type either with or without an epitactic layer, which serves as are collector in the finished transistor. A base region is produced in the substrate, e.g. by diffusion. An emitter region is produced in the base region, e.g. by alloying.

The collector-base capacitance and the base spreading resistance are important parameters for the high frequency behavior of the above described mesa transistors. Because of the small size of the transistor system, however, the application of electrodes involves technological difficulties. The collector-base capacitance of a mesa transistor may be diminished by reducing the mesa area. Since the collector-base pn junction is located in the mesa, the "plate area," based on a "plate-capacitor" model, becomes smaller, the capacitance of the pn junction and thus the capacitance of the transistor becomes smaller. An arbitrary reduction of the mesa area is not possible, however, since on one hand the base and emitter electrodes, which are to be applied to appropriate regions of the mesa, must "fit" the mesa, and on the other hand contacting of arbitrarily small electrodes can no longer be controlled, for example by thermocompression. Hence, there are fundamental limits regarding a reduction of the collector-base capacitance, by reducing the mesa dimensions.

Furthermore, the base spreading resistance, i.e. the resistance of the base region between the emitter-base pn junction and the base electrode is also determined by the base electrode, since the current field density is a function of the electrode geometry. Thus, it has been shown that the base spreading resistance is a smaller value when the base electrode annularly surrounds the emitter electrode. For the above-stated reasons, it is known to shape the base electrode in mesa transistors as the form of a ring or of a U around the emitter electrode. By selecting this type of geometry, specific mesa sizes give with the known technological measures for the collector-base capacitance and for the base spreading resistance, relatively good high frequency characteristics of mesa transistors.

The width of the electrode, however, must be greater than a specific value, otherwise contacting can no longer be controlled from a technical point of view. If the electrodes are to be of the magnitude required for contacting, then, because of the area requirements, the mesa must be made sufficiently large to accommodate the electrode. This, in turn, has an adverse influence upon the collector-base capacitance.

The present invention has as an object improving the high frequency characteristics of a mesa transistor, especially the collector-base capacitance and base spreading resistance parameters, while maintaining technical control as to contacting.

Our present invention achieves this object by a geometrical formation of the base-emitter electrode, whereby the mesa area and thus also the collector-base pn junction area, remain small enough to produce as small a collector-base capacitance as possible, and achieving a small base spreading resistance, due to an extensive enclosure of the base electrode by the emitter electrode, while at least a portion of the electrodes has sufficiently large area for contacting purposes.

Thus, we provide in a mesa transistor with a substrate semiconductor body serving as a collector, and with a base region and an emitter region located in said semiconductor body, with the emitter electrode being surrounded by the base electrode in the shape of a U, a base electrode asymmetrical to an axis which extends parallel to the legs of the U.

Figure 2:
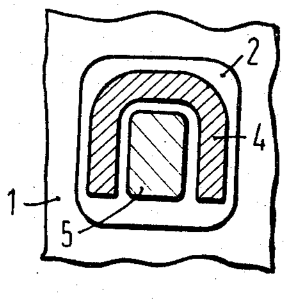

Additional details of the present invention will be derived from the embodiment examples, referring to FIGS. 1–5 in which in FIG. 1, a base region 2 of opposite conductance is produced, e.g. by diffusion, in a collector substrate 1 of a specific conductance type, provided with a large area electrode 6. The base region 2 contains an emitter region 3 of conductance opposite to the base. The emitter region 3 may be produced so that by alloying in its electrode 5, whereby an appropriate amount of doping material is added to the electrode material to be alloyed, it is alloyed or diffused into base region 2, thus forming the emitter region. The base electrode 4 is vapor-deposited upon the base region. FIG. 2 shows the configuration of the base electrode 4 and the emitter electrode 5.

Figure 3:
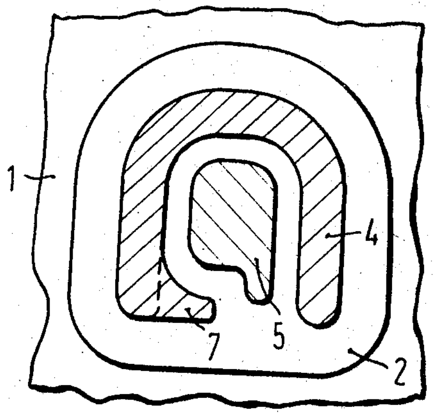

FIG. 3 is a top view of the mesa of a mesa transistor whose base and emitter electrodes 4 or 5 are developed in accordance with the present invention. The base electrode 4 has a flap or tongue-like extension 7 on one of the legs, and the emitter electrode 5 has an appropriate reduction of area in the shape of the extension at the corresponding location. In this type of electrode geometry, the electrode area is reduced for the purpose of obtaining the above-stated conditions. In the region of the extension 7, the area of the base electrode is still large enough to effect contacting. The remaining portion of the base area may be smaller so that altogether a smaller mesa area, i.e. a small collector base pn junction area, is possible. A large area contacting region remains in the emitter electrode while the remaining electrode area becomes smaller.

Figure 4:
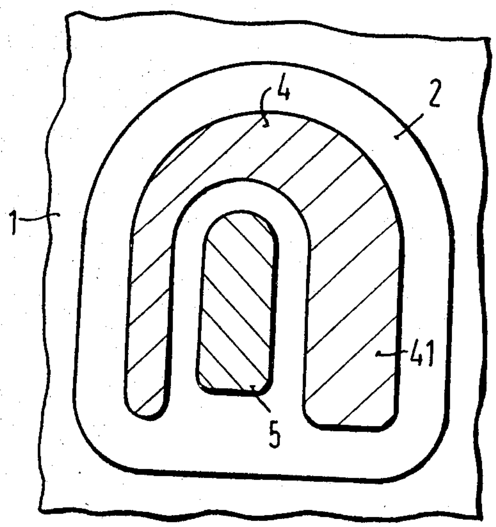

In FIG. 4 showing another embodiment of our invention, the leg 41 of the U-shaped base electrode 4 has a larger area for contacting purposes, while the area of the other leg remains very small.

Figure 5:
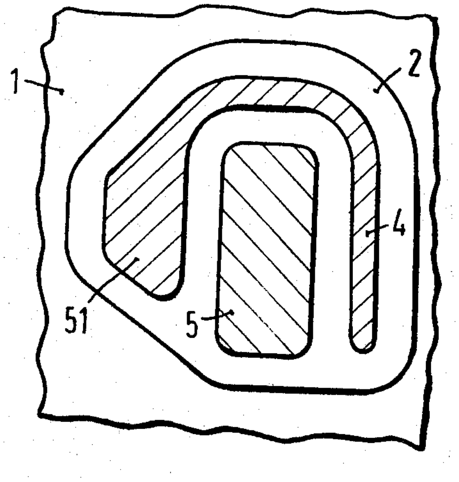

In FIG. 5, the leg 51 of the base electrode 4, is trapezoidal for contacting purposes. The remaining area of the base electrode may be very small.

Thus, in the illustrated embodiment examples, a reduction of the mesa area becomes totally feasible. This has a favorable influence upon the collector-base capacitance. Furthermore, in accordance with the development of the base electrode of the present invention, the emitter region is extensively surrounded so that the base spreading resistance assumes a favorable value.

It should further be noted that the drawings are not to scale but rather offer a schematic illustration of the electrode geometry.

We claim:

1. In a mesa transistor, having a substrate semiconductor body which serves as collector, with a base region and an emitter region located in said substrate and whose emitter electrode is surrounded in form of a U by the base electrode, the improvement which comprises forming the base electrode asymmetrical to an axis which extends parallel to the legs of the U.

2. The mesa transistor of claim 1, wherein one of the legs of the U shaped base electrode has at its free end a flap-like extension which points inwardly, perpendicularly from the leg axis and the emitter electrode has, at the corresponding location, a cross section reduction corresponding to the flap-like extension.

3. The mesa transistor of claim 1, wherein the width of one of the legs of the U base electrode is large compared to the width of the other leg.

4. The mesa transistor of claim 1, wherein one of the legs of the U shaped base electrode is trapezoidal.

5. The mesa transistor of claim 4, wherein the width of the trapezoidal leg is large compared to the other leg of the electrode.

References Cited

UNITED STATES PATENTS

| | | | |
|---|---|---|---|
| 3,324,360 | 6/1967 | Joachens | 317—235 |
| 3,327,181 | 6/1967 | Williams | 317—235 |
| 2,970,896 | 2/1961 | Corneleson | 41—43 |
| 3,312,881 | 4/1967 | Yu | 317—235 |

JOHN W. HUCKERT, *Primary Examiner.*

M. EDLOW, *Assistant Examiner.*

U.S. Cl. X.R.

317—234